US006661817B1

(12) United States Patent
Ames et al.

(10) Patent No.: US 6,661,817 B1
(45) Date of Patent: Dec. 9, 2003

(54) LASER DIODE MONITORING VIA CURRENT MIRRORING

(75) Inventors: Stephen John Ames, Rochester, MN (US); Michael William Marlowe, Rochester, MN (US); Christopher K. White, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 176 days.

(21) Appl. No.: 09/955,545

(22) Filed: Sep. 18, 2001

(51) Int. Cl.[7] ............................................. H01S 5/0683
(52) U.S. Cl. .................................................. 372/29.021
(58) Field of Search ..................................... 372/29.021

(56) References Cited

U.S. PATENT DOCUMENTS 5,920,438 A * 7/1999 Christensen et al. .......... 360/46
5,956,168 A    9/1999 Levinson et al. ............. 359/152
6,028,871 A * 2/2000 Vaughan et al. ............... 372/38
6,528,777 B2 * 3/2003 Ames et al. ............. 250/214 R

* cited by examiner

Primary Examiner—James Davie
(74) Attorney, Agent, or Firm—Wood, Herron & Evans LLP

(57) ABSTRACT

An apparatus, program product and method enable a host system to read a signal or signals that are proportional to the output power and/or the bias of a laser in a fiber optic link connected to that host system without breaking that link. By reading one or more of these signals and being aware of the laser characteristics, the "health" of the laser is known and the integrity of the link is maintained. Consequently, the host system has a predictive tool which is able identify substandard lasers and replace them before a serious, and potentially costly, data disruption occurs.

38 Claims, 3 Drawing Sheets

LASER DIODE MONITORING VIA CURRENT MIRRORING

FIELD OF THE INVENTION

The invention is generally related to lasers and fiber optic communication links. More specifically, the invention is generally related to monitoring the performance and operational status of a laser and thereby maintaining the integrity of a fiber optic link.

BACKGROUND OF THE INVENTION

Today, optical fibers form the backbone of a global telecommunication system. These strands of glass, each thinner than a human hair, are designed to carry huge amounts of data transmitted by tightly focused laser beams. Together, optical fibers and lasers have dramatically increased the capacity of the telephone and data systems. With equal improvements in computing, mankind has become dependant on this communication technology.

Thus, maintaining the integrity of a fiber optic communications link has become critical, particularly in these high capacity telephone and data systems. Failure to properly maintain a link can result in severed communications as well as data disruptions since both voice and data may be carried on the same fiber. This can lead to lost revenues since people often do not reestablish calls once they have been interrupted or "dropped." Further, reestablished calls and data links must be rerouted by the host system over another link. This results in delays as well as the additional time and effort required for rerouting, not to mention reduced system capacity.

Often, breaks in these links can be traced to failures of laser diodes that transmit data over these fibers. These laser diodes function to transmit voice and data through modulation of their photonic emission. Laser diodes are "biased" by a DC current which causes them to emit radiation at a particular frequency. This emission frequency is then varied, or "modulated," by an AC current in response to voice or data which is desired to be transmitted. Experience has shown that most laser diodes do not fail catastrophically but rather slowly deteriorate in performance, drawing more and more bias and modulation current to generate the amount of output power necessary to maintain the link. At some point, the amount of current required becomes so burdensome to the electronic driver that the link is broken.

Once a link breaks, a technician must be dispatched to diagnose and repair the broken link. To diagnose the link, the technician must disconnect the optical fiber from the laser module and connect it to an optical power meter in order to measure the optical output power. Based on the optical output power, a diagnosis is made. Many times, the optical output power is too low due to a failure of the laser diode in the laser module. The technician must then either replace the laser diode or install another laser module. Often a new laser module is installed in the interest of time and cost, and the link is restored.

This process of measuring the optical output power of a laser can also be preformed in an effort to predict potential failures in the future. However, the skill of the technicians which perform the measurements becomes paramount as the orientation of the fiber in relation to the optical power meter can significantly effect the amount of output power measured. This along with the amount of time, effort, and manpower, as well as reduced system capacity, that accompany this approach make service providers which use fiber optic links reluctant to use this process.

In most systems, a laser diode controller is used to maintain constant laser output power. In these types of systems, a monitor photo-diode is integrated into the laser diode package and receives light from either the back facet of the laser diode or a back reflection of the main beam from the laser diode package window. Thus, the collected laser power incident on the monitor photo-diode is proportional to the outgoing optical power. The monitor diode then converts this representative average optical power to an average current which serves as a feedback signal to the controller. The controller then compares this feedback signal against a reference current in order to maintain constant output power. As such, these laser diode controllers provide no externally readable monitor feature which describes the laser power being produced. Rather, the only indicator of laser output power is used as a control signal for purposes of maintaining constant output power.

Further, many of these systems provide no means of externally monitoring the bias or modulation currents and thus, provide no manner of monitoring the health of such links. Other systems, on the other hand, have attempted to provide more robust control and monitoring functionality in a link itself. For example, some designs rely on microprocessor control and painstakingly thermally characterize each laser used in every laser module produced in an effort to preempt laser failure. From this thermal characterization, a table is created for each module that relates the bias and modulation currents to temperature through the operating range of the laser in the module. The table is then stored in memory provided in the laser module. The microprocessor in the laser module then includes firmware that routinely monitors the laser's thermal operating condition as well as onboard digital-to-analog convertors that control and adjusted the bias and modulation currents. The microprocessor is then operative to compare the set points of the digital-to-analog converters with the bias and modulation currents stored in the memory-based look up table at the present operating temperature as a method of predicting laser failure. Obviously, the use of a microprocessor to provide more robust control and monitoring functionality is an expensive solution particularly when a host system may rely on multiple laser modules.

Therefore, a significant need exists in the art for a manner of cost effectively monitoring the output power of a laser in a fiber optical link or module, and in particular a manner of monitoring the output power of a laser without having to break a link.

SUMMARY OF THE INVENTION

The invention addresses these and other problems associated with the prior art by providing an apparatus, circuit arrangement, and method to monitor the output power and/or the bias of a laser used in a fiber optic link, which often does not require breaking the link. Output power is monitored in part through the use of a current mirror that outputs a signal proportional to the optical output power of the laser. By providing a signal which is proportional to optical power, a host system such as a computer or other data processing system has the ability to read the signal and calculate, as desired, the optical power output of the laser. Thereby, the host system is often further able to determine laser performance and preempt laser failure.

Similarly, the bias of a laser is monitored through the use of a current mirror that outputs another signal proportional to the bias of the laser. By providing a signal which is proportional to the bias, a host system has the ability to read this second signal and calculate the bias of the laser. Again, the host system is often able to use either one or both of these monitors to determine laser performance and preempt laser failure.

In one embodiment consistent with the invention, the signal that is proportional to the optical power is provided by current mirroring the monitor diode current typically used for maintaining constant output power. The mirrored current is then converted to a monitor voltage by a current to voltage converter circuit. In one embodiment of the invention, the monitor voltage is presented directly to an analog-to-digital converter within the host system. In another embodiment of the invention, the monitor voltage is digitized in a laser transceiver and delivered to the host system via a digital interconnect. In some embodiments, the host system may then be operative, using coefficients located in the transceiver nonvolatile memory, to calculate the optical power by reading the monitor voltage. As such, the host system is capable of monitoring the laser optical power output without disrupting the link.

In yet another embodiment consistent with the invention, the laser diode bias current is current mirrored. Once again, the mirrored current is converted to a voltage. This voltage, in one form or another, is monitored by a host system. The host system is then operative, using coefficients located in the transceiver module memory, to calculate the laser diode bias current.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there are described exemplary embodiments of the invention.

DETAILED DESCRIPTION

Figure 1:
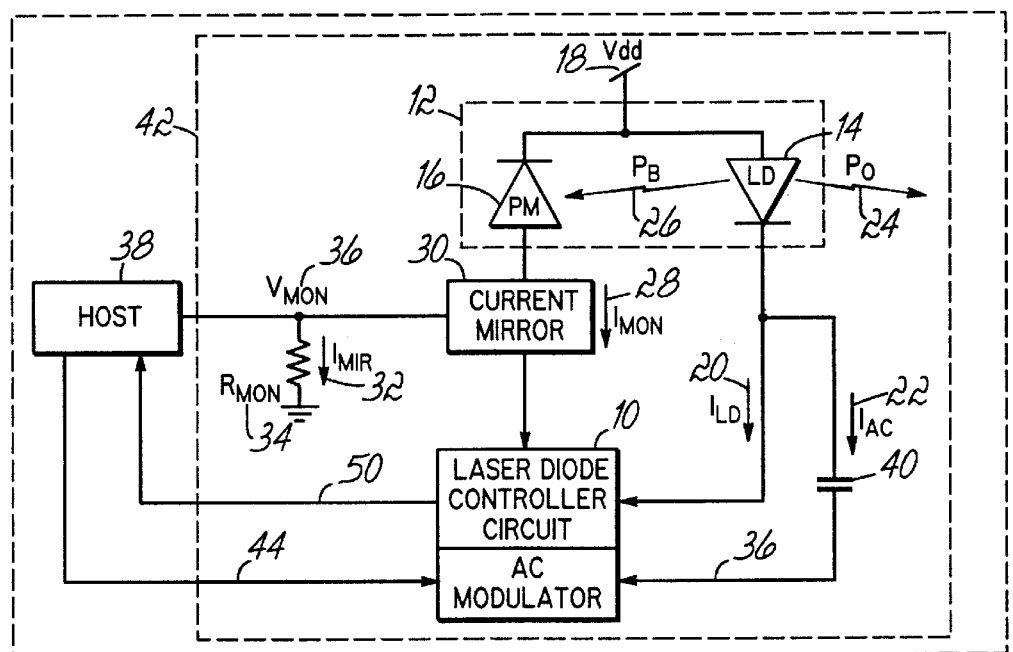
FIG. 1 is a block diagram of a laser disposed in a fiber optic communication link transceiver supported by a host system, illustrating the signals used for monitoring laser output power in a manner consistent with the present invention.

Turning to the Drawings, wherein like numbers denote like parts throughout the several views, FIG. 1 illustrates a block diagram of a laser disposed in a fiber optic communication link transceiver 42 supported by a host 38 consistent with the present invention. As further shown in FIG. 1, a laser diode controller circuit 10 is operational to maintain a constant output power ($P_O$) 24 from a laser diode package 12. The laser diode package 12 is comprised of a laser diode (LD) 14 and an integrated photo-monitor (PM) diode 16.

Laser diode (LD) 14 is maintained in steady state operation based on settings for particular communications protocols during the manufacturing process. Parameters controlling optical power, extinction ratio, and laser safety are all controlled by the laser diode controller circuit 10. Normally, these parameters are set via resistor potentiometers, electrically erasable potentiometers (EEPOTS) or digital to analog (D/A) converters. EEPOTS and D/A converters generally have nonvolatile memory registers that hold the settings in the event there is a power reset. Upon reset, if no faults are detected, laser biasing and control are operational. Data from the host 38 is via a high speed, controlled impedance path 44 which, in turn, modulates the laser diode 14 AC drive current 22. In steady state conditions, where temperature and supply voltage are constant, the DC bias current $I_{LD}$ 20 (FIGS. 1 and 2) and AC modulated current $I_{AC}$ 22 (FIGS. 1 and 2) are constant as well. Currents replicating $I_{MON}$ 28 and $I_{LD}$ 20 generate monitor voltages $V_{LD}$ 46 and $V_{MON}$ 36.

Coefficients are typically downloaded by a host 38 via a control line 50 from the laser diode controller circuit 10 in the transceiver 42, and are used by the host 38 to calculate the output power for the laser diode 14. One skilled in the art will recognized that other type of lasers could also be employed and configured in a similar manner. Similarly, control line 50 in this embodiment is configured as a CMOS/TTL control line; however, the control line is not limited to a CMOS/TTL control line and could be a type of data buss.

One skilled in the art should also appreciated that the invention may be implemented with any number of host systems such as computers and data processing systems, dedicated or otherwise. Similarly, other programmable electronic devices may also be used (e.g. embedded controller and the like). In addition, these host systems may serve as, or be a part of, a variety of telecommunications applications that transmit and receive voice and data.

PM diode 16 is oriented in the laser diode package 12 such that it receives light from either the back facet of the LD 14 or a back reflection of the main beam ($P_B$) 26 from the laser diode package 12 window, depending on the type of laser diode package 12 employed in a particular embodiment of the present invention. One skilled in the art will note that other devices that provide a signal that is proportional to the laser output power like PM diode 16, could serve as alternatives to PM diode 16 in other embodiments of the present invention. Some such devices could be beam splitters, power dividers, couplers, and mixers, any of which could be contained in a variety of packaging configurations.

When the LD 14 is in steady state operation, two currents are sourced from a power supply (Vdd) 18 by the LD controller circuit 10. The first current is the bias current ($I_{LD}$) 20, or bias signal, which causes the LD 14 to emit coherent light, disposing the LD 14 for modulation. The second signal is the modulation current ($I_{AC}$) 22, or modulation signal, which causes the emission of the LD 14 to carry an intelligence signal. A capacitor 40 is shown in the path of the modulation current ($I_{AC}$) 22 for purposes of illustrating that modulation current ($I_{AC}$) 22 is an AC signal whereas the bias current ($I_{LD}$) 20 is a DC signal.

Figure 3:
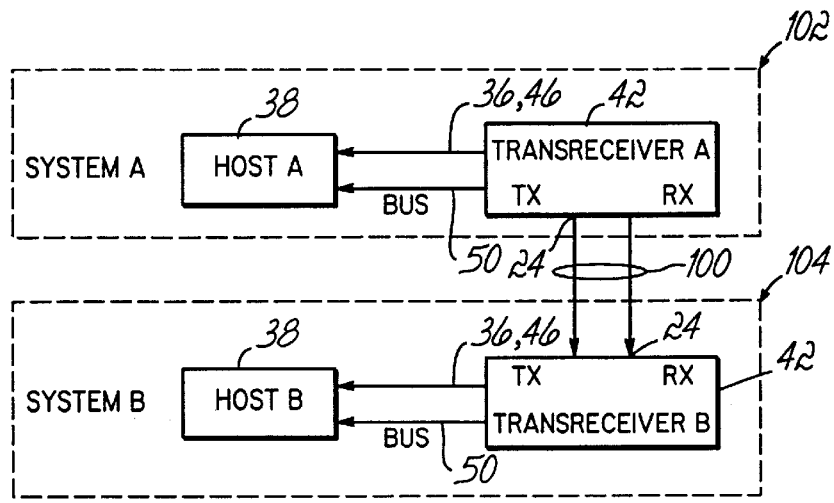
FIG. 3 is a block diagram of two systems, each containing an embodiment of the present invention, connected by a duplex fiber optic link.

The majority of the optical power ($P_O$) 24 emitted by the LD 14 is delivered to an optical fiber 100, as shown in FIG. 3 for example. However, a small portion of the optical power emitted is either collected from a reflection off the laser diode package 12 window or the back facet of the LD 14, as previously stated. Thus, the collected laser power incident ($P_B$) 26 on the PM diode 16 is proportional to the outgoing optical power ($P_O$) 24. The PM diode 16 converts this representative average optical power ($P_B$) 26 into an average current which serves as a feedback signal ($I_{MON}$) 28. The feedback signal ($I_{MON}$) 28 is fed through a current mirror 30 to the laser diode controller 10. The laser diode controller circuit 10 then compares this feedback signal ($I_{MON}$) 28 against an internal reference current generating a signal that is then used in the control of the optical output power of the laser ($P_O$) 24. The reference current mentioned is set in manufacture by using potentiometers, EEPOTS or D/A convertors as discussed hereinbefore. EEPOTS and D/A convertors typically have associated nonvolatile memory which controls the resistive value of an accompanying potentiometer, as also mentioned. These potentiometers are often tied to a reference voltage, such as a band gap reference voltage. Thus, changing the set value of these potentiometers changes the reference current for the laser diode controller circuit 10. It is therefore through the physical arrangement of the PM diode 16 in relation to the LD 14 and the electrical arrangement of the PM diode 16 and LD 14 in relation to the reference voltage in the laser diode controller 10 that the output power of the laser is internally controlled within the transceiver.

One skilled in the art will also note that a wide variety of circuits for the laser diode controller 10 are within the ability of one of ordinary skill in the art and that of these implementations, a number of known controller designs could be used. One skilled in the art will further recognize that of this variety of circuits, a functionality similar to that described for the controller herein could be provided without departing from the spirit of the present invention.

A monitor circuit comprising an output circuit coupled to a current mirror 30 is employed to generate a signal that varies in proportion to the optical output power of the laser ($P_O$) 24. The current mirror 30 generates a signal that is proportional to the feedback signal ($I_{MON}$) 28. This proportional current mirrored signal ($I_{MIR}$) 32, is then dropped across a resistor ($R_{MON}$) 34 producing a voltage ($V_{MON}$) 36. As configured, voltage ($V_{MON}$) 36 is thus proportional to the output power ($P_O$) 24. The host 38 may then monitor voltage ($V_{MON}$) 36 and calculate the output power ($P_O$) 24 based on the following equation: $P_O = C_O + C_1 * (V_{MON})$ Coefficients $C_O$ and $C_1$ are characterized in manufacture and stored in nonvolatile memory in the transceiver, as previously discussed. The host 38 has knowledge of the memory map location of these coefficients and is operational to read the coefficients $C_O$, $C_1$ via digital buss 50. As configured, this embodiment provides for a processor-less fiber optic transceiver capable of supplying a host with the analog signal necessary for monitoring the optical output power of a laser.

One skilled in the art will further note that a variety of circuits for the current mirror 30 are within the ability of one of ordinary skill in the art and that of the implementations, a number of known current mirror designs could be used. One skilled in the art will still further recognize that of this variety of circuits, a functionality similar to that described for the current mirror herein could be provided without departing from the spirit of the present invention.

In addition, one skilled in the art will notice that resistor ($R_{MON}$) 34 is used to perform a current to voltage conversion of current mirrored signal ($I_{MIR}$) 32. However, any number of alternative circuits commonly used and known by one skilled in the art could have be used to output an appropriate signal that is proportional to the optical output power to the host system in a like manner. Some such devices and circuits are other current to voltage converts, current sensors, operational amplifiers, and dedicated integrated circuits.

Further, one skilled in the art will recognize that, although this particular illustration of the present invention shows an analog voltages ($V_{MON}$) 36 and/or ($V_{LD}$) 46, provided by a transceiver 42 which is then monitored by a host 38, an alternative embodiment of the present invention could include an analog-to-digital conversion process within the transceiver such that a digital representation of the analog voltages ($V_{MON}$) 36 and/or ($V_{LD}$) 46 is monitored by a host system without departing from the spirit of the invention. Further, various other modifications to the particular embodiment described herein which allow a host system to monitor one or more analog, digital, parallel or serial data representations of current or voltage signals that are alone or in combination proportional to the control signal being current mirrored by the current mirror circuit, and thus proportional to the laser output power, could also be made without departing from the spirit of the present invention.

The aforementioned coefficients ($C_O$, $C_1$) can be derived is several ways. For example, $I_{MON}$ 28 is a current that is generated within the laser diode package 12 by an integrated PM diode 16 that picks up a known fraction of the outgoing laser light emitted from the back facet of the laser diode. Thus, $I_{MON}$ 28 is representative of the average power being delivered to the optical fiber. In manufacture, data points can be taken from a voltage, (e.g., $V_{MON}$ 36) derived from $I_{MON}$ 28 at preset drive levels (e.g., a various combinations of values for $I_{LD}$ 20 and $I_{AC}$ 22) to derive an equation that would allow a host system 38 to estimate the actual currents. The coefficients of this equation are the coefficients ($C_O$, $C_1$) referenced and described herein.

One skilled in the art will note that these data points could also be stored in nonvolatile memory. The host 38 could then be made operative to download the data points and derive the equation as a precursor to monitoring the health of the laser diode 12. The host 38 may then sample voltage $V_{LD}$ 46 representing the DC bias current ($I_{LD}$) 20 and calculate the laser bias current ($I_{LD}$) 20. Similarly, the host 38 may sample voltage ($V_{MON}$) 36 representing the average optical power ($P_O$) 24 and calculate the average optical power ($P_O$) 24 coming out of the laser diode 14. The host could then perform an evaluation to determine if the results were within a given tolerance range for a statical fit in the derived equation. Thus, the host 38 might predict the health of the laser diode 12. Therefore, one skilled in the art will recognize that the foregoing, as described, is an alternative embodiment of the present invention and does not depart from the spirit of the invention.

An important factor with some embodiments of the invention may be temperature compensation. Every laser technology has a unique response to temperature. Slope efficiency, or the laser's ability to convert electrons to photons, is a function of temperature. Semiconductor process variation can cause variation in the slope efficiency of the lasers produced. In the real world usage, it is often not economically feasible to pattern each laser for slope efficiency versus temperature. However, laser manufacturers can provide statistical data so that a range for the slope efficiency can be determined. Since a laser's bias and modulation currents should remain constant at a given operating temperature, if a host system 38 were coupled to a thermal sensor configured to monitor a laser's operating temperature, a host system 38 may also be able to create a historical database that reflects a laser's drive currents versus operating temperature. The manufacturer's original production data for the laser, taken at ambient temperature, could serve as the seed for this database. A host system 38 may be made operative to determine whether a laser was damaged during installation based on comparisons between the sampled currents and temperature and the values found in the database. This is yet another embodiment of the present invention that will be recognized by one skilled in the art.

In host systems 38 without temperature monitors, variations in slope efficiency due to changes in ambient temperature can be dealt with from a statistical basis and laser manufacturer data can be used to set a range for the actual slope efficiency of the lasers used. One skilled in the art will recognized that this still does not depart form the sprit of the present invention.

Figure 2:
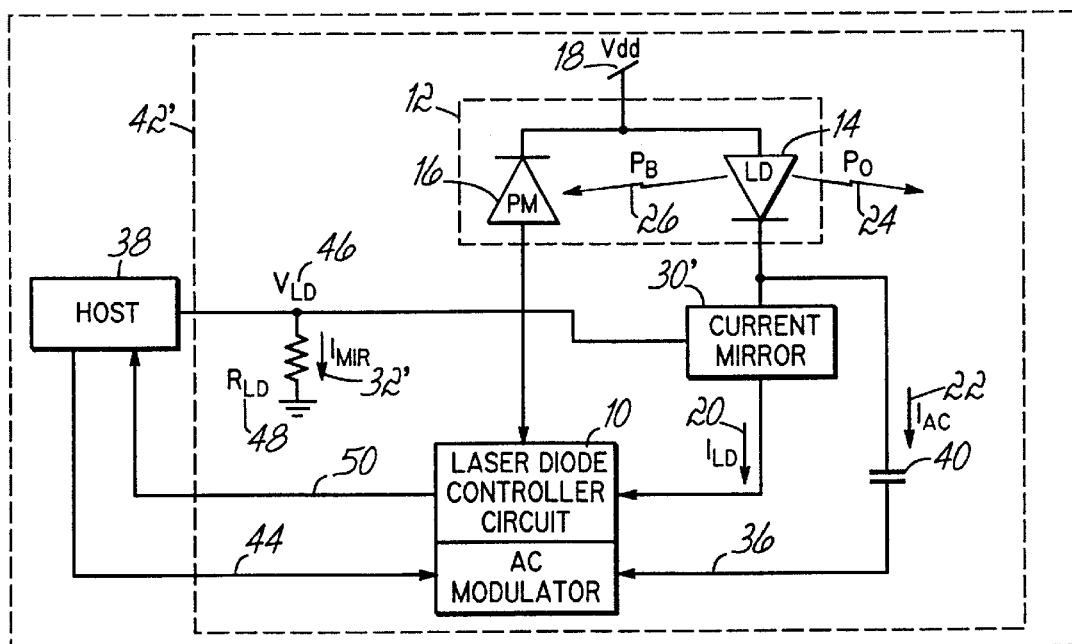
FIG. 2 is a block diagram of a laser disposed in a fiber optic communication link transceiver supported by a host system, illustrating the signals used for monitoring laser bias current in a manner consistent with the present invention.

Turning to FIG. 2, an embodiment configured for monitoring laser bias current in a manner consistent with the present invention is shown. In this embodiment, the laser diode bias current ($I_{LD}$) 20 is current mirrored using the current mirror 30'. The proportional current mirrored signal ($I_{MIR}$) 32' is then dropped across resistor ($R_{LD}$) 48 producing a voltage ($V_{LD}$) 46. Voltage ($V_{LD}$) 46 is thus proportional to the laser diode bias current ($I_{LD}$) 20. The host 38 may then monitor ($V_{LD}$) 46 and calculate the laser diode bias current ($I_{LD}$) 20 based on the following equation: $I_{LD}=C_O+C_1*(V_{LD})$ where coefficients $C_O$ and $C_1$ are located in nonvolatile memory in the transceiver and are download by the host 38, as previously described. As configured, this embodiment provides for a processor-less fiber optic transceiver capable of supplying a host with the analog signal necessary for monitoring the bias of a laser. Similar to the aforementioned embodiments described hereinbefore, a variety of modifications can be made to this embodiment without departing from the scope of the present invention.

Turning to FIG. 3, a block diagram of two systems 102,104, each containing the optical power and/or DC bias current monitoring features of the present invention described hereinbefore, connected by a duplex fiber optic link 100 is shown. In these systems 102, 104, the hosts 38 download via a control line 50 the coefficients ($C_O$, $C_1$) necessary to calculate the dc bias current 20 of the laser and/or the power output 24 delivered to the duplex fiber optic link 100. Once the downloads are complete, the hosts 38 may sample the $V_{LD}$ 46 and/or $V_{MON}$ 36 voltages. The hosts 38 may then, using the respective downloaded coefficients ($C_O$, $C_1$), utilize the afore-provided equations to calculate the dc bias current ($I_{LD}$) 20 of the laser and/or the output power ($P_O$) 24 of each transceiver 42. The hosts 38 may then be made operational using software to determine the "health" of the laser. Thus, an advantage of the present invention is that a host 38 may be disposed to monitor the link 100 in "real-time" and predict laser failure without interrupting the link 100. Notice of such potential failure could be provided to a system manager that could then schedule maintenance before the link failed. The present invention also provides for collection of historical performance data on lasers used in such links. As such, the systems 102, 104 have a predictive tool that is able identify substandard lasers and replace them before a serious, and potentially costly, data disruption occurs.

Once again, one skilled in the art will note that all of the aforementioned variations of the embodiment of the present invention discussed in conjunction with FIG. 1 apply equally as well in the systems 102, 104 shown in FIG. 3. Further, the systems 102, 104 in FIG. 3, could be a telephone and/or data system or a telecommunication system including any voice and data application. Similarly, the hosts 38 depicted FIG. 3 could be any computer or data processing system that has the ability to read and/or monitor a signal which is proportional to the optical output power of the transceivers 42. One skilled in the art will understand that although a host was shown for each system in FIG. 3, a single host could be configured to download coefficients, read signals, and calculate power from a plurality of transceivers or lasers.

Figure 4:
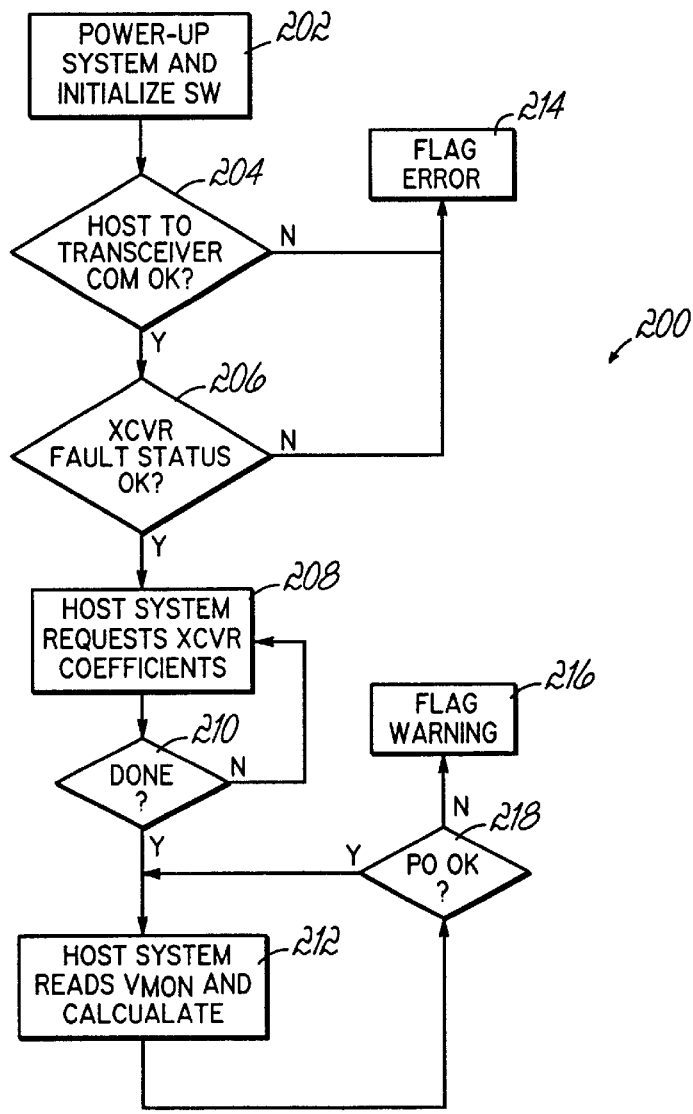
FIG. 4 is a flowchart illustrating the program flow of a process of monitoring laser output power in the host systems of FIGS. 1 and 3.

Turning now to FIG. 4, a flowchart illustrating the program flow of a process 200 of monitoring laser output power in the hosts 38 of FIGS. 1 and 3 is shown. The process 200 begins by powering up a system 102,104 and initializing the software as shown in block 202. Control is then passed to block 204 which locally determines whether the host 38 can communicate with the transceiver 42. If communication cannot be established, an error flag 214 is set and the process ceases. If communication is established, control of the process is passed to block 206. Block 206 locally determines whether the transceiver 42 is in fault status. If the transceiver 42 is in fault status, once again, an error flag 214 is set and the process ceases. However, if the transceiver is not in fault status, control is passed to block 208. In block 208, the host 38 requests the coefficients ($C_O$, $C_1$) necessary to calculate the power output 24. Next, block 210 continually loops control of the process to ensure that the host 38 receives the coefficients ($C_O$, $C_1$). Once the coefficients ($C_O$, $C_1$) are received by the host 38, control is passed to block 212. In block 212 the host 38 reads the monitor voltage ($V_{MON}$) 36, be it represented in analog or digital, and calculates the output power ($P_O$) 24. Once the output power ($P_O$) 24 has been calculated, control passes to block 218 wherein it is determined whether or not the output power ($P_O$) 24 is acceptable. If the output power ($P_O$) 24 is acceptable, control is returned to block 212 and the process proceeds as before. If the output power ($P_O$) 24 is not acceptable, a warning flag 216 is set which signifies that a substandard laser diode 14 should be replaced before a serious, and potentially costly, data disruption occurs.

Figure 5:
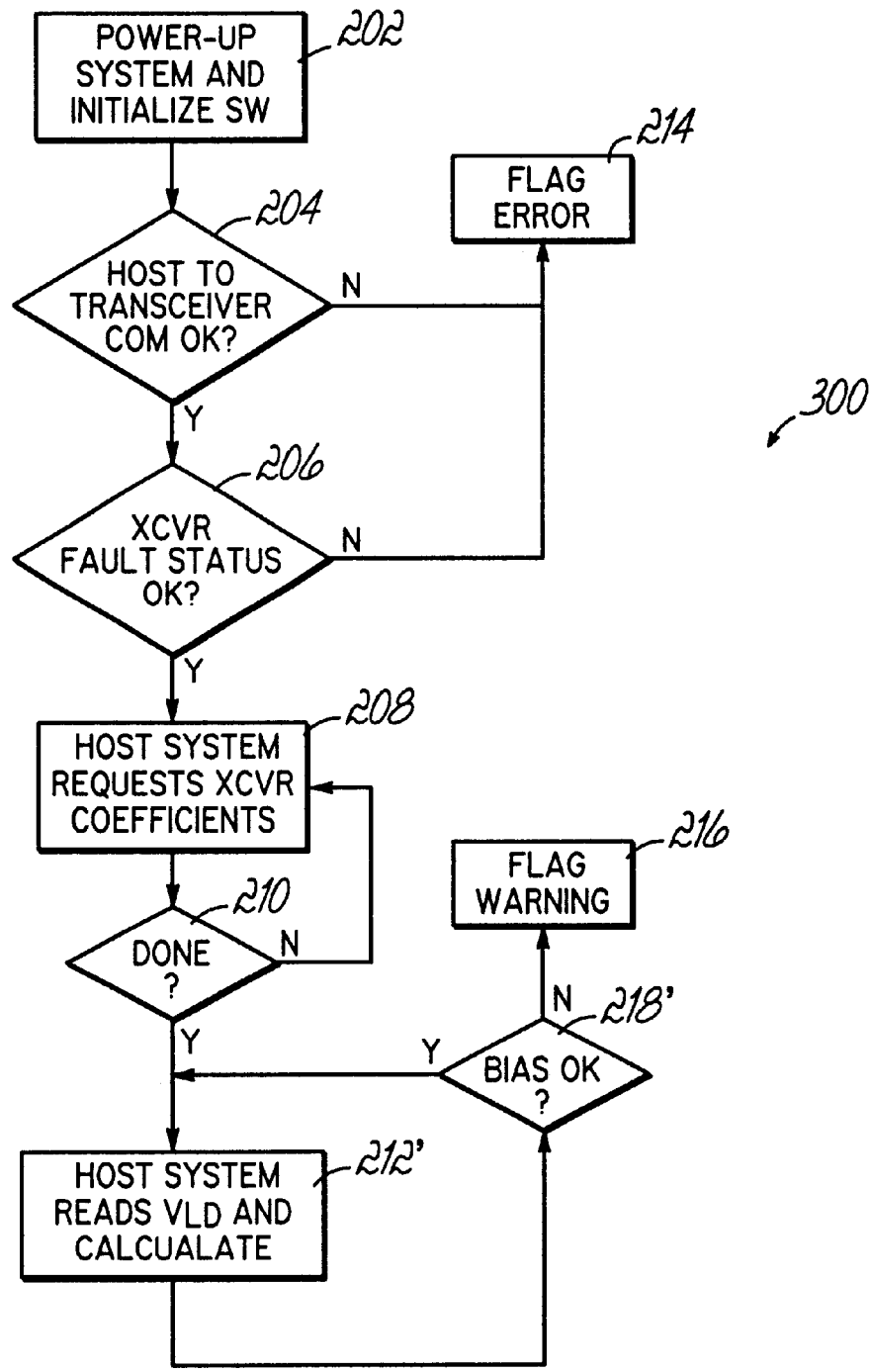
FIG. 5 is a flowchart illustrating the program flow of a process of monitoring laser bias in the host systems of FIGS. 2 and 3.

FIG. 5 illustrates a similar flowchart for a process 300 of monitoring the DC bias of a laser in the hosts systems of FIGS. 2 and 3. In this process 300, the host reads the monitor voltage ($V_{LD}$) 46 and calculates the laser DC bias current ($I_{LD}$) 20 in block 212'. Control is then passed to block 218' wherein it is determined whether or not the laser DC bias current is acceptable. As before, if the DC bias current ($I_{LD}$) 20 is not acceptable, a warning flag 216 is set which signifies that a substandard laser diode 14 should be replaced before a serious, and potentially costly, data disruption occurs.

Those skilled in the art will recognize that the exemplary environments illustrated in FIGS. 1, 2, 3, 4 and 5 are not intended to limit the present invention. Indeed, those skilled in the art will recognize that other alternative hardware and/or software environments may be used without departing from the scope of the invention.

What is claimed is:

1. A circuit arrangement comprising:
    (A) a current mirror that current mirrors a first variable signal used in the control of the optical output power of a laser; and,
    (B) an output circuit, coupled to the current mirror wherein the output circuit outputs a second signal that varies in proportion to the optical output power of the laser to provide an indication of the optical output power of the laser.

2. The circuit arrangement of claim 1, wherein the current mirror is a first current mirror that current mirrors a bias signal applied to the laser, the circuit arrangement further comprising a second current mirror that current mirrors a modulation signal used to modulate the bias of the laser.

3. The circuit arrangement of claim 1, wherein the laser comprises a diode laser.

4. The circuit arrangement of claim 1, wherein the first signal comprises a feedback signal.

5. The circuit arrangement of claim 4, wherein the feedback signal is generated by a monitor diode configured to receive light from the laser, and used by a controller circuit to control the optical output power of the laser.

6. The circuit arrangement of claim 1, wherein the first signal is coupled to a controller circuit that controls the optical output power of the laser.

7. The circuit arrangement of claim 1, wherein the output circuit includes a current to voltage convertor.

8. The circuit arrangement of claim 6, where the current to voltage convertor comprises a resistor.

9. The circuit arrangement of claim 7, wherein the output circuit further includes an analog to digital convertor coupled to the current to voltage convertor, wherein the second signal comprises a digital signal.

10. The circuit arrangement of claim 7, wherein the second signal is processed for output on a serial bus.

11. The circuit arrangement of claim 1, wherein the current mirror, output circuit, and laser are disposed in a fiber optic transceiver, and wherein the output circuit is configured to output the second signal external from the fiber optic transceiver.

12. The circuit arrangement of claim 1, wherein the output circuit is configured to output the second signal without interrupting an active link over which information is communicated by the laser.

13. The circuit arrangement of claim 1, wherein the laser comprises a monitor diode.

14. The circuit arrangement of claim 13, wherein the monitor diode is disposed to receive light from a back facet of the laser.

15. The circuit arrangement of claim 13, wherein the monitor diode is disposed to receive light from a back reflection of a main beam of the laser.

16. A method of monitoring the optical output power of a laser, the method comprising:
   (A) mirroring a current of a first variable signal that is used to control the optical output power of a laser to generate a mirrored signal that varies in proportion to the optical output power of the laser; and,
   (B) outputting the mirrored signal as an indication of the optical output power of the laser.

17. The method of claim 16, further comprising performing a current to voltage conversion prior to outputting the current mirrored signal.

18. The method of claim 17, further comprising performing an analog to digital conversion prior to outputting the current mirrored signal.

19. The method of claim 18, wherein outputting the current mirrored signal includes outputting the current mirrored signal in a serial format over a serial bus.

20. The method of claim 16, wherein the first signal is a feedback signal used to control the optical output power of the laser.

21. The method of claim 16, further comprising current mirroring a second signal, wherein the first signal comprises a bias current for the laser and wherein the second signal comprises a modulation signal for the laser.

22. The method of claim 16, furthers comprising downloading data from memory that is characteristic of the laser, and calculating the optical output power of the laser using the downloaded data and the current mirrored signal.

23. The method of claim 16, further comprising sampling and outputting the operating temperature of the laser.

24. The method of claim 16, wherein the laser is disposed in a fiber optic transceiver, the method furthers comprising:
   (A) receiving the current mirrored signal in a host external to the fiber optic transceiver; and
   (B) in the host, calculating the optical output power of the laser from the current mirrored signal.

25. The method of claim 24, further comprising signaling an error when the calculated optical output power of the laser falls outside of an acceptable range.

26. The method of claim 16, further comprising communicating information with the laser over an active link, wherein current mirroring the first signal and outputting the current mirrored signal are performed without interrupting the active link.

27. A fiber optic transceiver, comprising:
   (A) a laser;
   (B) a monitor circuit that current mirrors a first variable signal used to control the optical output power of the laser and outputs a current mirrored signal that is proportional to the optical output power of the laser to provide an indication of the optical output power of the laser.

28. The fiber optic transceiver of claim 27, wherein the monitor circuit comprises a current mirror circuit configured to current mirror the first signal, and an output circuit configured to generate the current mirrored signal.

29. The fiber optic transceiver of claim 28, further comprising a second current mirror circuit configured to current mirror a modulation signal used to modulate the bias of the laser; and, wherein the first signal comprises a bias signal used to bias the laser.

30. The fiber optic transceiver of claim 28, wherein the output circuit comprises a current to voltage convertor circuit coupled to the current mirror circuit.

31. The fiber optic transceiver of claim 30, wherein the output circuit further comprises an analog to digital convertor circuit coupled to the current to voltage convertor circuit.

32. The fiber optic transceiver of claim 27, furthers comprising a memory configured to store downloadable laser characteristic data.

33. The fiber optic transceiver of claim 27, further comprising:
   (A) a controller circuit disposed in the fiber optic transceiver and configured to control the optical output power of the laser; and
   (B) a monitor diode disposed in the fiber optic transceiver and configured to receive light emitted by the laser and generate therefrom a feedback signal to the controller circuit, wherein the monitor circuit is configured to current mirror the feedback signal generated by the monitor diode.

34. The fiber optic transceiver of claim 27, wherein the fiber optic transceiver is a processor-less fiber optic transceiver.

35. The fiber optic transceiver of claim 27, wherein the monitor circuit is configured to operate without interrupting an active link over which the fiber optic transceiver communicates information.

36. An apparatus, comprising:
   (A) a processor-less fiber optic transceiver, including:
      (i) a laser;
      (ii) a controller circuit configured to control the optical output power of the laser;
      (iii) a monitor diode configured to receive light emitted by the laser and generate therefrom a feedback signal to the controller circuit; and (iv) a monitor circuit that current mirrors the feedback signal and outputs therefrom a monitor signal that is proportional to the optical output power of the laser; and (B) a host coupled to the processor-less fiber optic transceiver, the host configured to receive the monitor signal and calculate therefrom the optical output power of the laser, the host further configured to signal an error in response to detecting the optical output power of the laser being outside an acceptable range.

37. The apparatus of claim 36, wherein the monitor circuit is configured to output the monitor signal while an active link is established with the fiber optic transceiver, and wherein monitoring of the optical output power of the laser is performed without interrupting the active link.

38. A circuit arrangement comprising:

(A) a current mirror that current mirrors a first variable signal used to bias a laser; and, (B) an output circuit, coupled to the current mirror, wherein the output circuit outputs a second signal that varies in proportion to the bias of the laser to provide an indication of the optical output power of the laser.

* * * * *